United States Patent [19]
Montoye

[11] Patent Number: 5,319,590
[45] Date of Patent: Jun. 7, 1994

[54] APPARATUS FOR STORING "DON'T CARE" IN A CONTENT ADDRESSABLE MEMORY CELL

[75] Inventor: Robert K. Montoye, Los Gatos, Calif.

[73] Assignee: HaL Computer Systems, Inc., Campbell, Calif.

[21] Appl. No.: 985,867

[22] Filed: Dec. 4, 1992

[51] Int. Cl.$^5$ ............................................. G11C 15/00
[52] U.S. Cl. ................................. 365/49; 365/189.01; 365/189.07
[58] Field of Search ................ 365/49, 189.01, 189.03, 365/189.07, 230.01

[56] References Cited

U.S. PATENT DOCUMENTS 4,646,271 2/1987 Uchiyama et al. ..................... 365/49

OTHER PUBLICATIONS

J. Koo, "Integrated-Circuit Content-Addressable Memories", JSSC, Oct. 1970.
J. Mundy, "Low-Cost Associative Memory", JSSC, Oct. 1972.
H. Kadota, "An 8-kbit Content-Addressable and Reentrant Memory", JSSC, Oct. 1985.
T. Ogura, "A 4-kbit Associative Memory LSI", JSSC, Dec. 1985.
S. Chae, "Content-Addressable Memory for VLSI Pattern Inspection", JSSC, Feb. 1988.
S. Jones, "A 9-kbit Associative Memory for High Speed Parallel Processing Applications", JSSC, Apr. 1988.
J. Wade & C. Sodini, "A Ternary Contents Addressable Search Engine", JSSC, Aug. 1989.
A. Goksel, "A Content Addressable Memory Management Unit with On-Chip Data Cache", JSSC, Jun. 1989.
T. Ogura et al., "A 20-kbit Associative Memory LSI for Artificial Intelligence Machines", JSSC, Aug. 1989.
H. Takata, "A 100-Mega-Access per Second Matching Memory for a Data-Driven Processor", JSSC, Feb. 1990.
G. Uvieghara, "An On-Chip Smart Memory for a Data-Flow CPU", JSSC, Feb. 1990.
H. Bergh, "A Fault Tolerant Associative Memory with High Speed Operation", JSSC, Aug. 1990.
M. Motomura, "A 1.2 Million Transistor, 33 Mhz, 20-b Dictionary Search Processor (DISP) ULSI with a 160 kb CAM", JSSC, Oct. 1990.
L. Tamura, "A 4 nsec BICMOS Translation-Lookaside Buffer", Oct. 1990.
F. Hermann, "A Dynamic Three-State Memory Cell for High-Density Associative Processors", JSSC, Apr. 1991.

*Primary Examiner*—Terrell W. Fears
*Attorney, Agent, or Firm*—Albert C. Smith

[57] ABSTRACT

A content addressable memory cell is able to store a state representing "Don't Care", by storing two bits of data. The "Don't Care" state is indicated by storing two identical bits corresponding to a predetermined value, so that the cell indicates a match regardless of the match data. When the cell is not in the "Don't Care" state, two complementary bits are stored, so that the cell indicates a match only when the match data matches the state of the first of the two bits.

12 Claims, 4 Drawing Sheets

APPARATUS FOR STORING "DON'T CARE" IN A CONTENT ADDRESSABLE MEMORY CELL

CROSS-REFERENCE TO RELATED APPLICATIONS

Montoye, "Content Addressable Memory Cell", filed Jul 16, 1992.

BACKGROUND OF THE INVENTION

1. Field of the Invention

This invention relates to content addressable memory cells and, more particularly, to a content addressable memory cell which can store a state representing "Don't Care".

2. Description of the Related Art

Content addressable memories (CAMs) compare a search word with a set of stored words. An indication of whether or not the search word matches the stored words is produced for each stored word. A distinguishing characteristic of a CAM is that each stored word is uniquely identified on the basis of the content of the word itself, rather than by its address within the memory array as in conventional digital memories.

A CAM includes an array of memory cells arranged in a matrix of rows and columns. Each memory cell stores a single bit of digital information. The bits stored in a row of memory elements constitute a stored word. During a match operation, a search word of input data is applied to all the rows, and an indication is produced for each row as to whether or not the search word matches the word stored therein.

Referring now to FIG. 1, there is shown a conventional CAM cell with match logic, according to the prior art. Each CAM cell stores one bit of data within a stored word. In the CAM cell, a storage cell 101 comprises two inverters 101a and 101b connected to form a flip-flop. FIG. 2 shows a typical implementation of the flip-flop using two n-type transistors 201b and 201d, and two p-type transistors 201a and 201c.

The flip-flop has two states: In one state the signal "a" is high, and in the other state it is low. The signal "b" is always the complement of "a". Bit lines BL and $\overline{BL}$ are connected to the storage cell 101 via access gates, here shown as transistors 103 and 104. A word line designated as W is connected to the gate terminal of each access transistor, and extends out to other cells in the same word row. Match logic 102 is connected to the storage cell and to the bit lines. This match logic has an output designated as MV, which indicates the presence of a match.

The operation of the conventional CAM of FIG. 1 will now be described. Bit lines BL and $\overline{BL}$ have two functions: a read/write function and a match function. To perform a read/write function, the word line W is used to activate the access transistors 103 and 104. Thus, an electrical connection is made between the bit lines BL and $\overline{BL}$ and the two terminals of the storage cell 101. Once this connection has been established, the bit lines can either read the state of the storage cell, or write a state onto the cell.

When the access transistors 103 and 104 are deactivated, the storage cell 101 is isolated from BL and $\overline{BL}$. In this situation, BL and $\overline{BL}$ can be used for their match function. A state is asserted on one of the bit lines, and its complement is asserted on the other bit line. If the state of $\overline{BL}$ matches the state of signal "a", the MV signal will float; if there is no match, MV will be pulled low. For example, suppose we wish to check if "a" is high. A high signal is placed on the $\overline{BL}$ line and a low signal placed on BL. If "a" is high, transistor 102b will be on, transistor 102a will be off (because BL is low), transistor 102d will be off (because "b" is low), and transistor 102c will be off (because its source terminal is floating). Thus, MV will float, indicating a match. If "a" is low, transistors 102b and 102a will be off, and transistors 102d and 102c will be on (because both $\overline{BL}$ and "b" are high). Thus, MV will be pulled low, indicating no match.

It can therefore be seen that, when access transistors 103 and 104 are off and the storage cell 101 is isolated from the bit lines, the match logic 102 can be used to check for matches between the bit lines and the data stored in the cell.

When searching for matches in a CAM, it is known in the art to specify "Don't Care" in one or more bits of the search word. Specifying "Don't Care" means that the CAM cell should signal a match regardless of the state of its stored bit. One technique for specifying "Don't Care" in the search word is to pull both BL and $\overline{BL}$ low. Following the match logic shown in FIG. 1, it can be seen that this would result in MV floating (indicating a match) regardless of the state of the flip-flop.

The technique of specifying "Don't Care" in the search word is useful for searching for ranges of words. For example, to search for all words falling within the range 1011000 to 1011111, one might specify the search word 1011XXX (where "X" represents "Don't Care"). This search word would match with any word falling within the range. This technique can generally be used only on continuous ranges of words; discontinuous ranges require multiple search words.

The technique of specifying "Don't Care" in the search word is to be distinguished from specifying "Don't Care" in the stored data. When "Don't Care" is specified in the search word, a storage cell will indicate a match regardless of the state of its stored bit. On the other hand, when "Don't Care" is stored in the stored data, the cell will indicate a match regardless of the state of the match data. Although it is known in the art to specify "Don't Care" in the match data, conventional CAM design does not have the capability to specify "Don't Care" in the stored data. This technique is useful in applications where multiple discontinuous ranges of words are to be specified.

SUMMARY OF THE INVENTION

In accordance with the present invention, there is provided a content addressable memory cell which is capable of storing a "Don't Care" state in which a match will be indicated regardless of the state of the match data.

This is achieved by providing two storage cells within each CAM cell. The two storage cells store two bits, permitting a total of four states: "0", "1", "Don't Care", and a fourth state which may be left unused or may indicate "Invalid". The match logic of the CAM is connected to the two storage cells so that when the CAM is in the "Don't Care" state, a match will be indicated regardless of the match data.

The features and advantages described in the specification are not all-inclusive, and particularly, many additional features and advantages will be apparent to one of ordinary skill in the art in view of the drawings, specification, and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

DESCRIPTION OF THE PREFERRED EMBODIMENT

Figure 1:
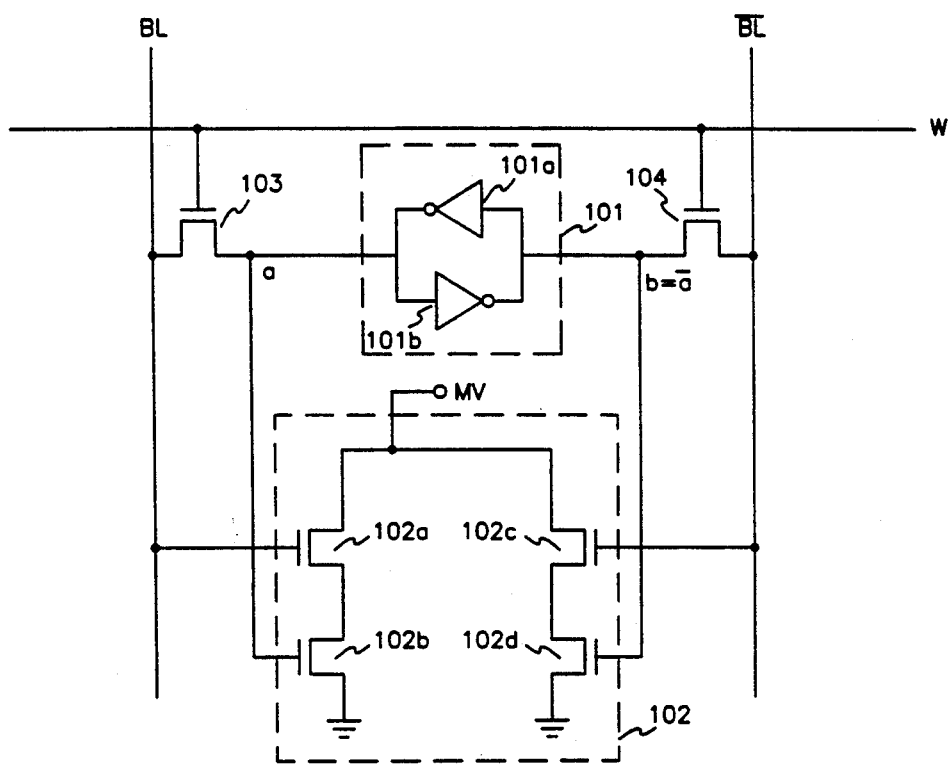
FIG. 1 is a diagram of a content addressable memory (CAM) cell, including match logic, according to the prior art.
Figure 2:
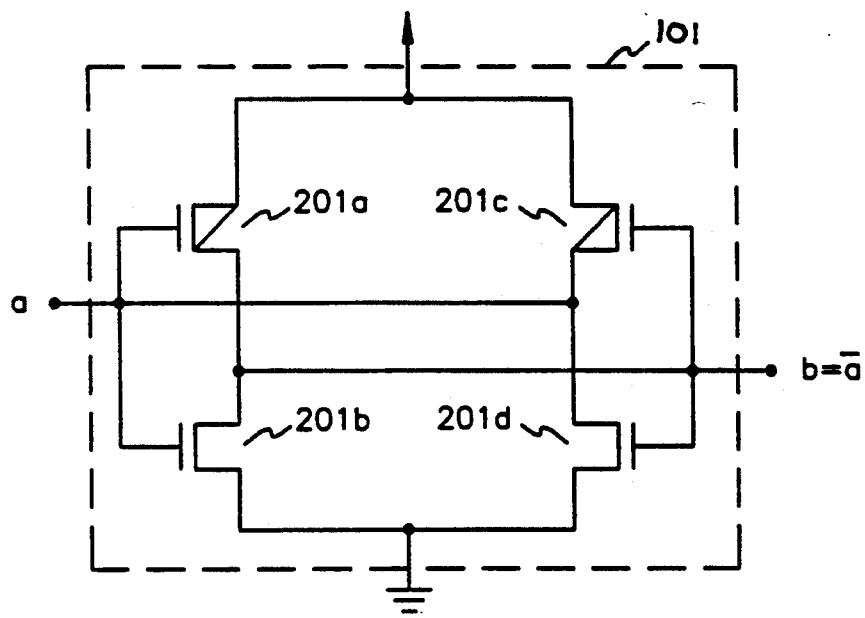
FIG. 2 is a diagram of a flip-flop storage cell according to the prior art.
Figure 3:
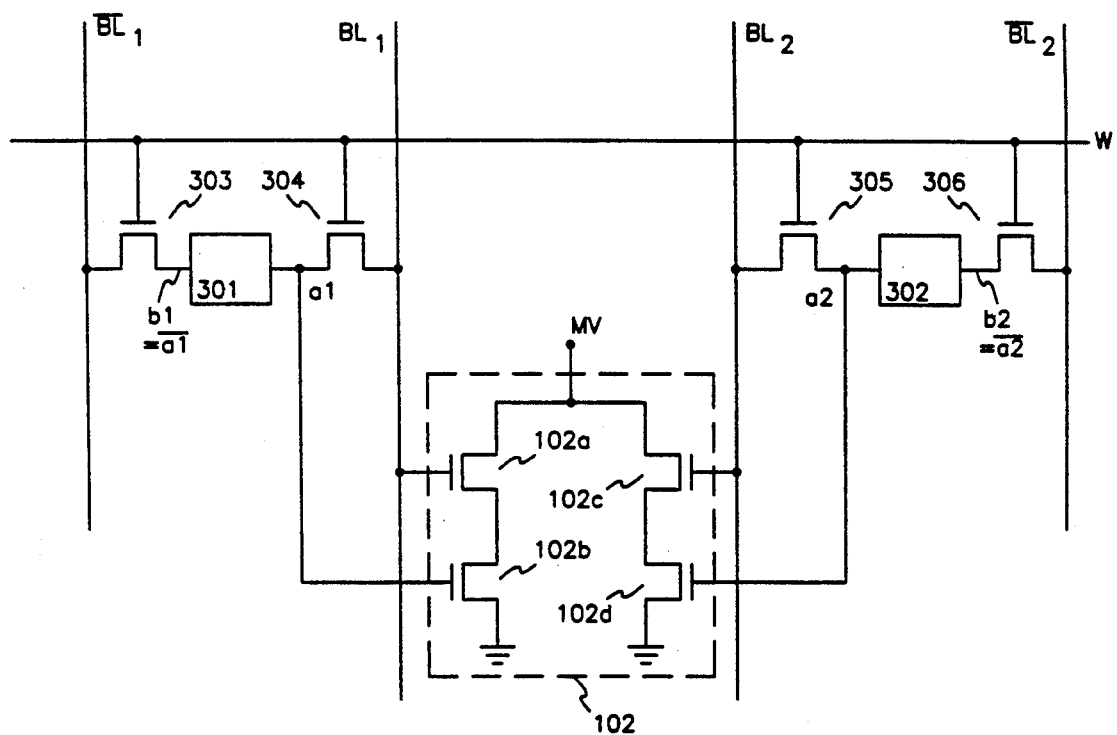
FIG. 3 is a diagram of the CAM cell of the present invention, which is capable of storing "Don't Care".
Figure 4:
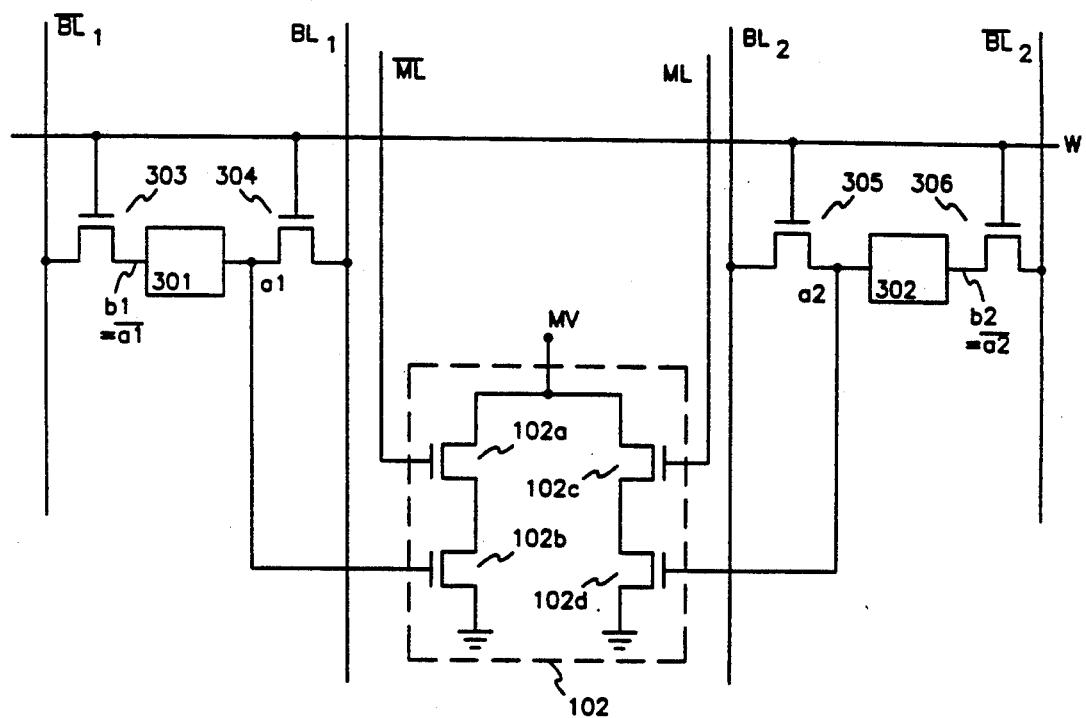
FIG. 4 is a diagram of an alternative embodiment of the invention, wherein the CAM cell has match lines independent of the bit lines.

FIGS. 3 and 4 depict two preferred embodiments of the present invention for purposes of illustration only. One skilled in the art will readily recognize from the following discussion that alternative embodiments of the structures and methods illustrated herein may be employed without departing from the principles of the invention described herein.

Referring now to FIG. 3, there is shown a diagram of a preferred embodiment of the current invention. Two storage cells, 301 and 302, are used. Storage cell 301 stores one bit and produces two signals, "a1" and "b1", which are complements of each other, while storage cell 302 stores a second bit and produces signals "a2" and "b2", which are complements of each other. There are two sets of bit lines: Bit lines $BL_1$ and $\overline{BL_1}$ are connected to storage cell 301 via access transistors 303 and 304, while bit lines $BL_2$ and $\overline{BL_2}$ are connected to storage cell 302 via access transistors 305 and 306. The word line W is connected to the gate terminals of all four access transistors. The match logic 102 is connected to bit lines $BL_1$ and $BL_2$. As in the prior art, the match logic 102 has an output MV, which indicates the presence of a match.

Each of the signals "a1" and "a2" can be high or low, yielding four possible states for the CAM cell. One possible interpretation of the four states is given in the following table:

| a1 | a2 | Meaning |
|---|---|---|
| Low | Low | X (Don't Care) |
| Low | High | 0 |
| High | Low | 1 |
| High | High | Unused or Invalid |

The "0" and "1" states, where the storage cells store complementary bits, correspond to the two states of a conventional CAM as described above. The "Don't Care" state, where the storage cells both store "Low", is used when it is necessary for the CAM to indicate a match regardless of the match data. The fourth state, where the storage cells both store "High", may be left unused, or it may be used to indicate an invalid bit of data.

It is important to note that the above table only shows one possible interpretation of the states of the CAM; other interpretations, such as one in which High/High indicates "Don't Care" and Low/Low indicates "Invalid", are also possible.

In the embodiment of the invention shown in FIG. 3, the read/write function operates in essentially the same manner as in the prior art, except that two sets of bit lines are used. In particular, the write function requires the input value to be asserted on $BL_1$ (to be written into cell 301) and its complement to be asserted on $BL_2$ (to be written into cell 302). When a "Don't Care" value is to be written into the CAM cell, both $BL_1$ and $BL_2$ are pulled low. The read function requires that both $BL_1$ and $BL_2$ be examined, in order to determine whether the CAM cell contains a valid bit ("0" or "1"), a "Don't Care", or if applicable, an "Invalid" bit.

To perform the match function, all four access transistors, 303, 304, 305, and 306, are deactivated. The match data is asserted on line $BL_2$, and its complement is placed on $BL_1$. If the state of $BL_2$ matches the state of the CAM cell, the MV signal will float; if there is no match, MV will be pulled low. For example, suppose we wish to check if the state of the cell is "1". A high signal is placed on the $BL_2$ line and a low signal placed on $BL_1$. If the CAM cell's state is "1", then "a1" will be high and "a2" will be low (see the table above). Therefore, transistor 102b will be on (because "a1" is high), transistor 102a will be off (because $BL_1$ is low), transistor 102d will be off (because "a2" is low), and transistor 102c will be off (because its source terminal is floating). Thus, MV will float, indicating a match. If the CAM cell's state is "0", then "a1" will be low and "a2" will be high. Then, transistors 102b and 102a will be off, and transistors 102d and 102c will be on (because both $BL_2$ and "a2" are high). Thus, MV will be pulled low, indicating no match.

If the CAM cell's state is "Don't Care", then both "a1" and "a2" will be low. Then, transistors 102b and 102d will both be off, causing the source terminals of transistors 102a and 102c to float. Therefore, no matter what signal is supplied on $BL_1$ and $BL_2$, MV will float. As a result, when the cell is in the "Don't Care" state, it will always respond with a match.

If the CAM cell is in the fourth state, both "a1" and "a2" will be high. Then, transistors 102b and 102d will both be on, causing the source terminals of transistors 102a and 102c to be pulled low. Therefore, whenever one of the lines $BL_1$ or $BL_2$ is asserted, MV will be pulled low, indicating no match. As a result, when the CAM cell is in this fourth state, it will never respond to match when complementary signals are supplied on $BL_1$ and $BL_2$. As mentioned above, this state could be used to indicate an invalid bit of data.

Referring now to FIG. 4, there is shown an alternative embodiment of the invention. Here, the match criteria bits are provided along match lines ML and $\overline{ML}$ rather than on $BL_2$ and $BL_1$. This embodiment includes the invention described in a U.S. patent application Ser. No. filed Jul. 16, 1992 by Montoye for a "Content Addressable Memory Cell." In this embodiment, match data may be asserted on the match lines without interfering with read/write operations on the same cell or other cells in the same row. This embodiment permits a match operation to be performed in the same clock cycle as a read/write operation, as described in that application.

From the above description, it will be apparent that the invention disclosed herein provides a novel and advantageous apparatus for storing "Don't Care" in a content addressable memory cell. The foregoing discussion discloses and describes merely exemplary methods and embodiments of the present invention. As will be understood by those familiar with the art, the invention may be embodied in other specific forms without departing from the spirit or essential characteristics thereof. For example, different forms of the storage cells, access gates, or match logic may be used in place of those described in the above description and corresponding diagrams. Also, the designations "High" and "Low", as well as "1" and "0" may be transposed. Accordingly, the disclosure of the present invention is intended to be illustrative, but not limiting, of the scope of the invention, which is set forth in the following claims.

What is claimed is:

1. A content addressable memory cell, comprising:
   a storage portion having at least two terminals, for storing two bits of data and for generating a signal on each of the terminals, the first signal corresponding to the first bit and the second signal corresponding to the second bit, such that there is a first state in which the two bits are complementary, a second state in which the two bits are complementary and opposite to their status in the first state, and a third state in which the two bits are identical, for representing "Don't Care";
   reading/writing means, connected to the terminals of the storage portion, for reading data bits from and writing data bits to the storage portion; and
   a match detector having a first match input for accepting match data, two data inputs each connected to a corresponding terminal of the storage portion, and an output, such that a match at the output is signaled when the status of the first match input is the same as the status of the first data input, or when the status of the first and second data inputs is identical and corresponds to a predefined "Don't Care" signal.

2. The content addressable memory cell of claim 1, wherein the storage portion comprises a first storage cell and a second storage cell, each of the storage cells having a terminal corresponding to one of the terminals of the storage portion.

3. The content addressable memory cell of claim 2, wherein the match detector further comprises a second match input for accepting a complement of the match data.

4. The content addressable memory cell of claim 3, wherein the reading/writing means comprises:
   first access means for selectively accessing the first storage cell;
   second access means for selectively accessing the second storage cell;
   a first bit line connected to the first access means and to the first match input, the first bit line having a first mode for reading from and writing to the first storage cell, and a second mode for supplying the match data to the first match input; and
   a second bit line connected to the second access means and to the second match input, the second bit line having a first mode for reading from and writing to the second storage cell, and a second mode for supplying a complement of the match data to the second match input.

5. The content addressable memory cell of claim 4, wherein:
   the first access means comprises a first access transistor having a source terminal connected to the terminal of the first storage cell, a drain terminal connected to the first bit line, and a gate terminal connected to a word line; and
   the second access means comprises a second access transistor having a source terminal connected to the terminal of the second storage cell, a drain terminal connected to the second bit line, and a gate terminal connected to the word line.

6. The content addressable memory cell of claim 5, wherein:
   the first storage cell further comprises a first inverter having an input and an output, the output connected to the terminal of the first storage cell, and a second inverter having an input connected to the output of the first inverter and an output connected to the input of the first inverter; and
   the second storage cell further comprises a third inverter having an input and an output, the output connected to the terminal of the second storage cell, and a fourth inverter having an input connected to the output of the third inverter and an output connected to the input of the third inverter.

7. The content addressable memory cell of claim 6, wherein the match detector comprises:
   a match valid line for signaling a match;
   a first transistor having a gate terminal connected to the first bit line, a source terminal, and a drain terminal connected to the match valid line;
   a second transistor having a gate terminal connected to the terminal of the first storage cell, a source terminal connected to ground, and a drain terminal connected to the source terminal of the first transistor;
   a third transistor having a gate terminal connected to the second bit line, a source terminal, and a drain terminal connected to the match valid line; and
   a fourth transistor having a gate terminal connected to the terminal of the second storage cell, a source terminal connected to ground, and a drain terminal connected to the source terminal of the third transistor.

8. The content addressable memory cell of claim 3, wherein the reading/writing means comprises:
   first access means for selectively accessing the first storage cell;
   second access means for selectively accessing the second storage cell;
   a first bit line connected to the first access means for reading from and writing to the first storage cell; and
   a second bit line connected to the second access for reading from and writing to the second storage cell.

9. The content addressable memory cell of claim 8, further comprising:
   a first match line connected to the first match input for supplying the match data to the first match input; and
   a second match line connected to the second match input for supplying a complement of the match data to the second match input.

10. The content addressable memory cell of claim 9, wherein:
    the first access means comprises a first access transistor having a source terminal connected to the terminal of the first storage cell, a drain terminal connected to the first bit line, and a gate terminal connected to a word line; and the second access means comprises a second access transistor having a source terminal connected to the terminal of the second storage cell, a drain terminal connected to the second bit line, and a gate terminal connected to the word line.

11. The content addressable memory cell of claim 10, wherein:
the first storage cell further comprises a first inverter having an input and an output, the output connected to the terminal of the first storage cell, and a second inverter having an input connected to the output of the first inverter and an output connected to the input of the first inverter; and
the second storage cell further comprises a third inverter having an input and an output, the output connected to the terminal of the second storage cell, and a fourth inverter having an input connected to the output of the third inverter and an output connected to the input of the third inverter.

12. The content addressable memory cell of claim 11, wherein the match detector comprises:
a match valid line for signaling a match;
a first transistor having a gate terminal connected to the first match line, a source terminal, and a drain terminal connected to the match valid line;
a second transistor having a gate terminal connected to the terminal of the first storage cell, a source terminal connected to ground, and a drain terminal connected to the source terminal of the first transistor;
a third transistor having a gate terminal connected to the second match line, a source terminal, and a drain terminal connected to the match valid line; and
a fourth transistor having a gate terminal connected to the terminal of the second storage cell, a source terminal connected to ground, and a drain terminal connected to the source terminal of the third transistor.

* * * * *